United States Patent
Ha et al.

(10) Patent No.: US 8,102,193 B2
(45) Date of Patent: Jan. 24, 2012

(54) CURRENT SENSING CIRCUIT

(75) Inventors: Chang-Woo Ha, Seongnam-si (KR); Jung-Ah Jang, Guro-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 28 days.

(21) Appl. No.: 12/643,393

(22) Filed: Dec. 21, 2009

(65) Prior Publication Data

US 2010/0164553 A1    Jul. 1, 2010

(30) Foreign Application Priority Data

Dec. 31, 2008 (KR) .................. 10-2008-0138064

(51) Int. Cl.
*H03B 1/00* (2006.01)

(52) U.S. Cl. ................... 327/108; 327/323; 327/512

(58) Field of Classification Search .................. 327/108, 327/109, 110, 111, 323, 512, 513

See application file for complete search history.

(56) References Cited

U.S. PATENT DOCUMENTS

| | | | | |
|---|---|---|---|---|
| 5,408,141 | A | * | 4/1995 | Devore et al. .................. 327/541 |
| 5,789,971 | A | * | 8/1998 | Colletti et al. ................. 327/541 |
| 5,796,278 | A | * | 8/1998 | Osborn et al. ................. 327/108 |
| 6,181,186 | B1 | * | 1/2001 | Itoh et al. ....................... 327/309 |

* cited by examiner

*Primary Examiner* — Jeffrey Zweizig
(74) *Attorney, Agent, or Firm* — Sherr & Vaughn, PLLC

(57) ABSTRACT

A current sensing circuit includes a power transistor, a sensing transistor configured to copy a current flowing through the power transistor at a predetermined ratio, a current sensing resistor configured to detect a voltage from the current copied by the sensing transistor, an input resistor configured to convert an input voltage to a current, a cross self-biasing cascade block configured to adjust currents at both ends of the input resistor, and a common gate transistor and a reference resistor configured to convert a current output of the input resistor to a final sense voltage.

10 Claims, 3 Drawing Sheets

CURRENT SENSING CIRCUIT

The present application claims priority under 35 U.S.C. §119 to Korean Patent Application No. 10-2008-0138064 (filed on Dec. 31, 2008), which is hereby incorporated by reference in its entirety.

BACKGROUND

A current technical trend for DC-DC converters includes downsizing, high efficiency and large capacity. In order to achieve downsizing, a system circuit of a board level is integrated into an integrated circuit (IC) level. Moreover, various techniques such as a current sensing technique have been proposed to implement the high efficiency.

On the contrary, a size of a power transistor (POWER TR) tends to increase for the large capacity. Yet, a size for power capacity is ongoing to decrease. Accordingly, if a large-scale current is detected by a current sensing method, such a disadvantage as downgraded efficiency, speed reduction, increasing errors and the like is considerable caused to degrade performance of a overall system.

Figure 1:
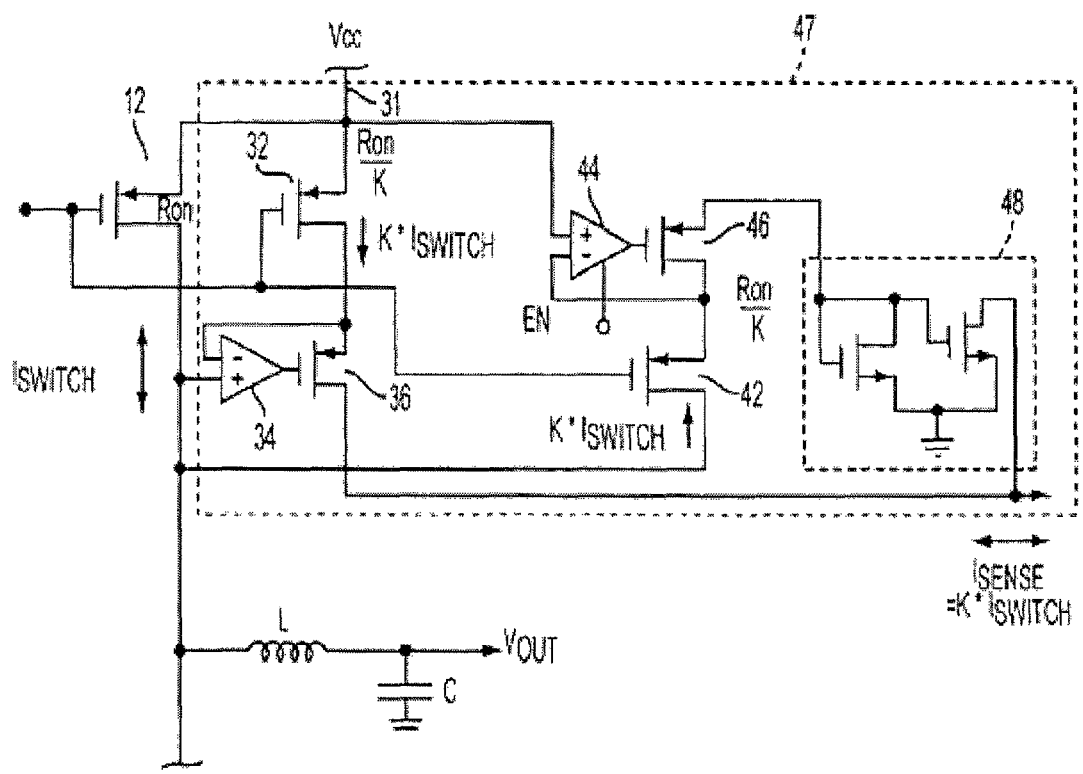

FIG. 1 is a diagram of a current sensing circuit for a sensing method in which a buck converter senses a current of a high-side switch.

As illustrated in FIG. 1, if a current flows out of a power TR 12 as a power switch, a negative feedback, which includes a sensing transistor (sense TR) 32, an OP-AMP 34 and a common gate TR 36, senses the current at a predetermined ratio.

Although this method causes no problem if on-resistance (Rdson) is equal to or greater than 1 ohm, it may cause or accelerate a variety of problems. For instance, if a ratio of Iswitch to Isense is raised by decreasing the on-resistance, current sensing error increases. Secondly, if a ratio of Iswitch to Isense is lowered by decreasing the on-resistance (Rdson), the Isense increases. Hence, sensing efficiency is abruptly lowered. Moreover, since the negative feedback is configured using the OP-AMP 34, limitation is put on a bandwidth. Still, an offset is generated by a gain of the OP-AMP 34, if a temperature varies, a signal waveform is distorted by a temperature coefficient difference of the common gate TR 36, the power TR 12 and the sense TR 32. Yet and still, distortion of a sensed current value is generated according to an input voltage range of the OP-AMP 34. Even still, it is unable to sense a fine current value (e.g., 100 mA~3 A) due to the limitation of the output voltage range of the OP-AMP 34.

Meanwhile, in order to raise efficiency of a DC-DC converter and implement a precise control thereof, various techniques for sensing the current flowing through the power TR 12 of the power switch are ongoing to be developed. These current sensing techniques are mainly categorized into a current sensing method by connecting resistors in series and a current sensing method via the sense transistor 32 using the same device as the power TR 12. However, as the capacity of the DC-DC converter increases, the above-mentioned problems will either be generated or become worsened.

SUMMARY

Embodiments relate to a converter, and more particularly, to a current sensing circuit. Although the present invention is suitable for a wide scope of applications, it is particularly suitable for maximizing converting efficiency as well as minimizing a loss caused in current sensing.

Embodiments relate to a current sensing circuit by which a current can be more precisely sensed by a DC-DC converter of 3 A or higher.

Embodiments relate to a current sensing circuit, by which a loss caused by current sensing can be minimized.

In accordance with embodiments, a current sensing circuit can include at least one of the following: a power transistor, a sensing transistor (M1) which copies a current flowing through the power transistor at a predetermined ratio, a current sensing resistor (R1) which detects a voltage from the current copied by the sensing transistor (M1), an input resistor which converts an input voltage (VIN) to a current, a cross self-biasing cascode block which adjusts currents at both ends of the input resistor, and a common gate transistor (M3) and a reference resistor (R4) configured to convert a current output of the input resistor to a final sense voltage (Visense).

In accordance with embodiments, the cross self-biasing cascode block equally adjusts the currents at both ends of the resistors (R2, R3) provided to the input resistor. The current sensing circuit may further include a current source for the both ends of the resistors (R2, R3) provided to the input resistor. The common gate transistor (M3) may include a common gate amplifier and delivers the current output to the reference resistor. Therefore, the reference resistor (R4) converts the current output delivered from the common gate transistor (M3) to the final sensing voltage (Visense). One (R2) of the input resistor and a gate capacitor of the common gate transistor (M3) is configured a low pass filter.

In accordance with embodiments, a current sensing circuit can include at least one of the following: a main power transistor that corresponds to a main power switch to perform a switching operation; a sensing transistor that copies a current flowing through the main power transistor at a predetermined ratio; a current sensing resistor that detects the current copied by the sensing transistor into a voltage; an input resistor including a first resistor and a second resistor, the input resistor converting an input voltage to a current; a cross self-biasing cascode block that equally adjusts the current to flow through both ends of the first and second resistors; a current source that is an end-to-end current source of the input resistor; a common gate transistor including a common gate amplifier; and a reference resistor that converts the current output from the input resistor to a final output voltage that represents a final sense voltage such that the common gate transistor delivers a single current output from the input resistor to the reference resistor.

In accordance with embodiments, a current sensing circuit can include at least one of the following: a first field effect transistor that corresponds to a main power switch and also performs a switching operation; a second field effect transistor that copies a current flowing through the first field effect transistor at a predetermined ratio; a current sensing resistor that detects the current copied by the second field effect transistor into a voltage; an input resistor including a first resistor and a second resistor connected to each other in parallel, the input resistor converting an input voltage to a current; a cross self-biasing cascode block that equally adjusts the current to flow through both ends of the first and second resistors; a current source that is an end-to-end current source of the input resistor; a common gate transistor comprising a common gate amplifier; and a reference resistor that converts the current output from the input resistor to a final output voltage that represents a final sense voltage such that the common gate transistor delivers a single current output from the input resistor to the reference resistor.

DRAWINGS

FIG. 1 illustrates a current sensing circuit for a current sensing method.

Figure 2:
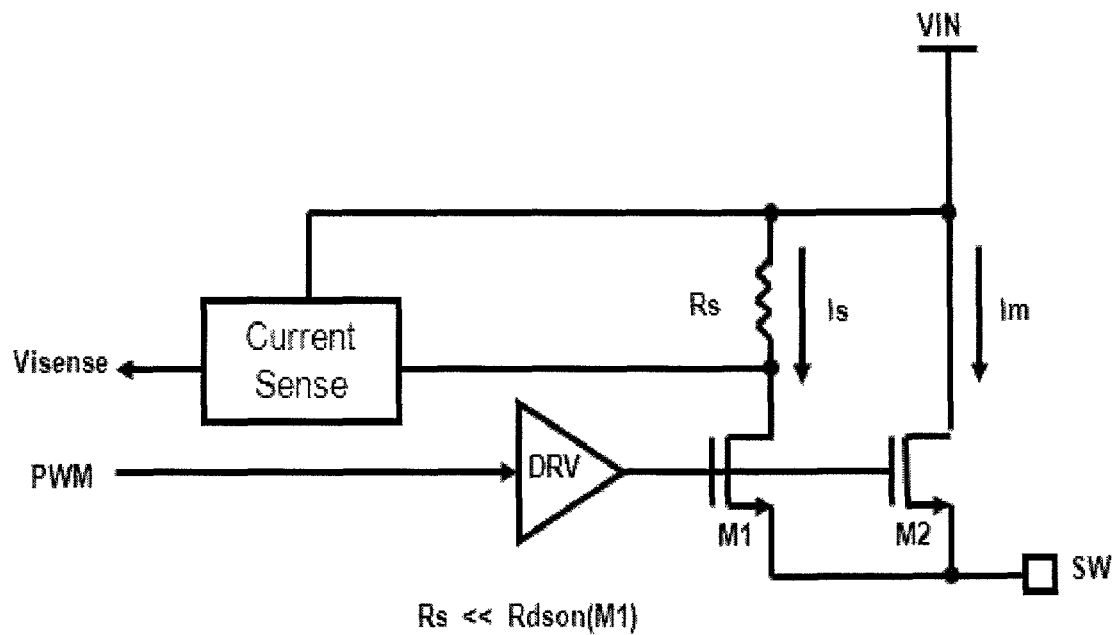
Figure 3:
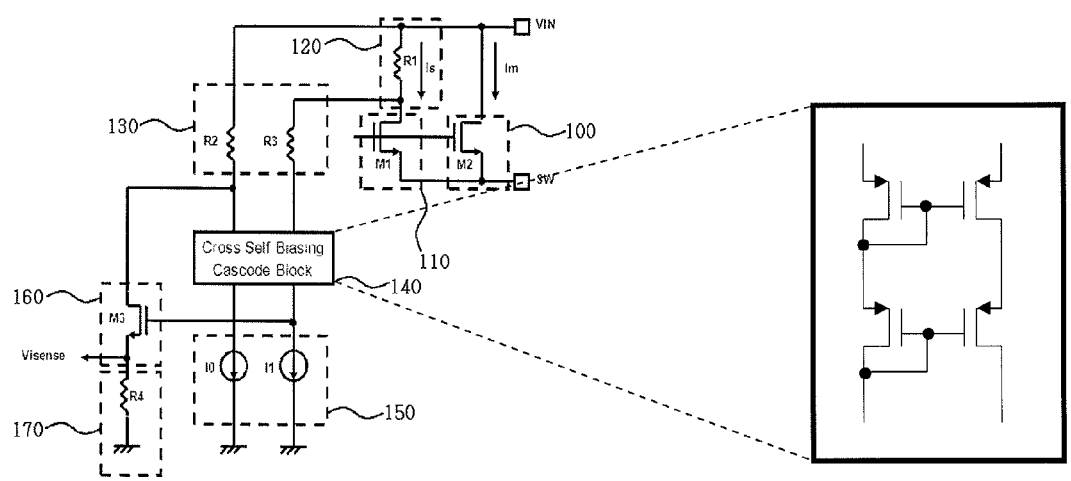

Example FIGS. 2 and 3 illustrate a current sensing structure and a current sensing circuit, in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

A current sensing circuit in accordance with embodiments is explained in detail with reference to the accompanying drawings as follows.

Example FIG. 2 is a diagram which describes a current sensing structure in accordance with embodiments.

As illustrated in example FIG. 2, M2 indicates a main power switch and M1 indicates a sensing transistor (TR). The sensing TR can include a field effect transistor (FET). A main current Im (i.e., an inductor current) flowing through the main power switch M2 is copied into the sense TR at a ratio of N:1. The copied current Is generates a sense voltage Vsen by flowing through a resistor Rs. A current sensing unit detects a difference between an input voltage VIN and the sense voltage Vsen and then outputs a final sense voltage Visense.

The current sensing structure illustrated in example FIG. 2 shows a general configuration in accordance with embodiments. However, if the on-resistance Rdson of the power transistor corresponding to the power switch is lower than 1 ohm, various problems may be caused. In such a case, in accordance with embodiments, a current sensing circuit illustrated in example FIG. 3 may be used.

Example FIG. 3 is a diagram of a current sensing circuit in accordance with embodiments.

As illustrated in example FIG. 3, a current sensing circuit in accordance with embodiments can include main power TR 100, sensing TR 110, current sensing resistor 120, input resistor 130, cross self-biasing cascode block 140, current source 150, common gate TR 160 and reference resistor 170. The main power transistor M2 corresponding to a main power switch performs a switching operation. Sensing TR (M1) 110 copies a main current Im (inductor current) flowing through main power TR (M2) 100 at a predetermined ratio. In this case, each of main power TR (M2) 100 and sensing TR (M1) 110 can include a field effect transistor (FET).

Current sense resistor (R1) 120 detects the current copied by sensing TR (M1) 110 into a voltage. Input resistor 130 includes a pair of resistors R2 and R2 connected to each other in parallel. Input resistor 130 converts an input voltage VIN to a current and then configures a gain of a whole sensing circuit. Cross self-biasing cascode block 140 adjusts the current to flow through both ends of resistors R2 and R3 of input resistor 130 equally. Current source 150 is an end-to-end current source of input resistor 130. Common gate TR (M3) 160 and reference resistor (R4) 170 convert a current output of input resistor 130 to a final sense voltage Visense.

Common gate TR (M3) 160 is a common gate amplifier and delivers a single current output from input resistor 130 to final reference resistor 170. Reference resistor (R4) 170 converts the current output to a final output voltage that is the final sense voltage Visense. Reference resistor (R4) 170 configures a gain of a whole circuit together with second resistor R2 corresponding to one of input resistor 130. For the current sensing circuit in accordance with embodiments, the final sense voltage Visense, which is a final output voltage, and a trans-impedance gain (GA) can be found by the following Formula 1.

$$Visense = [[(I_s \times R1) + (I_1 \times R3)]/R2 - I_0] \times R4 = (R4/R2) \times R1 \times I_s$$

$$GA = (R4/R2) \times R1$$

In Formula 1, $I_s$ indicates a current flowing through current sensing resistor (R1) 120. $I_1$ indicates a current applied from one current source of current source 150 to flow through the R3 of input resistor 130. $I_0$ is a current applied to one of the current source 150 to flow through second resistor R2 of input resistor 130. The final sensing voltage Visense, which is the final output voltage, is independent from a level of the input voltage VIN. Even if current sensing resistor R1 is considerably small (<<1 ohm), it is able to obtain a sufficient voltage by increasing the sense current ($I_s$).

In this case, the sense current $I_s$ merges with the main current $I_m$ flowing through main power TR 100 at a node SW and is then used for external switching. Therefore, loss is barely generated. Common gate TR (M3) 160, which is the common gate amplifier, has a low gain but provides a good frequency characteristic. Therefore, common gate TR can secure a wider band and delivers an output current to the reference resistor (R4) stably. Input resistor (R2) 130 and a gate capacitor of common gate TR (M3) 160 configures a low pas filter. Hence, if sufficient sizes are allocated to common gate TR (M3) 160 and input resistor (R2) 130, it is able to automatically reduce the sense nose.

A current sensing circuit in accordance with embodiments is explained in aspect of temperature.

If Formula 1 is converted to a formula for a temperature coefficient, Formula 2 can thereby be generated.

$$\Delta Visense/\Delta T = (\Delta R4/\Delta R2) \times \Delta R1 \times I_s = \Delta R1 \times I_s$$

According to Formula 2, if a resistor having a positive characteristic for a temperature is used as current sensor resistor (R1) 120, as the temperature rises higher, a gain increases more. Hence, it is able to quickly activate an overcurrent detecting function by interconnecting to a temperature characteristic. In particular, it is able to quickly activate an overcurrent protecting circuit by having current capacity and temperature interconnect to each other.

In accordance with embodiments, a loss caused by current sensing can be minimized while a DC-DC converter of large-scale capacity over 3A is enabled to sense a current more precisely. Therefore, conversion efficiency can be maximized. Since a current sensing circuit in accordance with embodiments does not use an OP-AMP, it is able to precisely sense a large current (1 mA~10 A) despite that on-resistance is very small (e.g., below 1 ohm). Moreover, since a current sensing circuit in accordance with embodiments uses a sensing current for sensing a current without loss in switching, it has high efficiency. Also, since a current sensing circuit in accordance with embodiments does not use an OP-AMP, it is free from an offset attributed to a gain of the OP-AMP. Although a temperature varies, there is no signal waveform distortion caused by an active device.

A current sensing circuit in accordance with embodiments enables current sensing irrespective of variations of temperatures and process parameters of a sense TR and a main power switch. If a sense resistor is designed to have a positive temperature coefficient, embodiments enables an overcurrent detecting function to be quickly activated by interconnecting to a temperature characteristic.

In accordance with embodiments, a low pass filter characteristic according to an input structure constructed with an input resistor and a common gate or base circuit is provided. Therefore, embodiments is able to automatically eliminate sensing current noise of high frequency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a power transistor;
   a sensing transistor configured to copy a current flowing through the power transistor at a predetermined ratio;
   a current sensing resistor configured to detect a sensing voltage from the current copied by the sensing transistor;
   a first input resistor configured to convert an input voltage to a first current, the first input resistor having a first end connected to an end of the current sensing resistor;
   a second input resistor configured to convert the sensing voltage to a second current, the second input resistor having a first end connected to another end of the current sensing resistor;
   a cross self-biasing cascode block configured to equally adjust the first and second currents at each end of the first and second input resistors;
   a common gate transistor and a reference resistor configured to convert a current output of the first and second input resistors to a final sense voltage; and
   a current source for each end of the first and second input resistors.

2. The apparatus of claim 1, wherein the common gate transistor comprises a common gate amplifier.

3. The apparatus of claim 1, wherein the common gate transistor is configured to deliver the current output to the reference resistor.

4. The apparatus of claim 1, wherein the reference resistor converts the current output delivered from the common gate transistor to the final sense voltage.

5. The apparatus of claim 1, wherein the first input resistor and a gate capacitance of the common gate transistor configures a low pass filter.

6. The apparatus of claim 1, wherein the sensing transistor comprises a field effect transistor.

7. An apparatus comprising:
   a main power transistor that corresponds to a main power switch to perform a switching operation;
   a sensing transistor that copies a current flowing through the main power transistor at a predetermined ratio;
   a current sensing resistor that detects the current copied by the sensing transistor into a voltage;
   an input resistor including a first resistor configured to convert an input voltage to a first current and a second resistor configured to convert the sensing voltage to a second current, wherein a first end of the first resistor is connected to an end of the current sensing resistor and a first end of the second resistor is connected to another end of the current sensing resistor;
   a cross self-biasing cascode block that equally adjusts the first and second currents to flow through each end of the first and second resistors;
   a current source that is an end-to-end current source of the input resistor;
   a common gate transistor including a common gate amplifier; and
   a reference resistor that converts the current output from the input resistor to a final output voltage that represents a final sense voltage,
   wherein the common gate transistor delivers a single current output from the input resistor to the reference resistor.

8. The apparatus of claim 7, wherein the first resistor of the input resistor configures a gain of the current sensing circuit after converting the input voltage to the current.

9. The apparatus of claim 7, wherein the main power transistor comprises a field effect transistor.

10. The apparatus of claim 7, wherein the sensing transistor comprises a field effect transistor.

* * * * *